(12) United States Patent
Chen et al.

(10) Patent No.: US 8,239,806 B2
(45) Date of Patent: Aug. 7, 2012

(54) ROUTING SYSTEM AND METHOD FOR DOUBLE PATTERNING TECHNOLOGY

(75) Inventors: Huang-Yu Chen, Zhudong Township, Hsinchu County (TW); Yuan-Te Hou, Hsinchu (TW); Gwan Sin Chang, Hsinchu (TW); Wen-Ju Yang, Hsinchu (TW); Zhe-Wei Jiang, Tainan (TW); Yi-Kan Cheng, Taipei (TW); Lee-Chung Lu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 249 days.

(21) Appl. No.: 12/649,979

(22) Filed: Dec. 30, 2009

(65) Prior Publication Data

US 2011/0119648 A1    May 19, 2011

Related U.S. Application Data

(60) Provisional application No. 61/261,852, filed on Nov. 17, 2009.

(51) Int. Cl.
*G06F 17/50* (2006.01)

(52) U.S. Cl. ............ 716/126; 716/54; 716/55; 716/130

(58) Field of Classification Search ........................ None
See application file for complete search history.

(56) References Cited

U.S. PATENT DOCUMENTS

| | | | |
|---|---|---|---|
| 7,531,449 B2 * | 5/2009 | Park et al. | 438/638 |
| 7,879,727 B2 * | 2/2011 | Postnikov et al. | 438/700 |
| 7,906,253 B2 * | 3/2011 | Aton et al. | 430/5 |
| 2007/0212648 A1 | 9/2007 | Lalbahadoersing et al. | |
| 2008/0244504 A1 | 10/2008 | Drapeau et al. | |
| 2009/0087619 A1 * | 4/2009 | Aton et al. | 428/156 |
| 2010/0176479 A1 * | 7/2010 | Postnikov et al. | 257/499 |
| 2011/0023002 A1 * | 1/2011 | Cheng et al. | 716/126 |
| 2011/0193234 A1 * | 8/2011 | Chen et al. | 257/773 |

OTHER PUBLICATIONS

M. Cho et al., Double Patterning Technology Friendly Detailed Routing, IEEE/ACM International Conference on Computer-Aided Design, pp. 506-511, Nov. 2008.*

R. Kruif et al., Wafer Based Mask Characterization for Double Patterning Lithography, 24th European Mask and Lithography Conference, pp. 71-82, Jan. 2008.*

(Continued)

*Primary Examiner* — Leigh Garbowski
*Assistant Examiner* — A. M. Thompson
(74) *Attorney, Agent, or Firm* — Duane Morris LLP; Steven E. Koffs

(57) ABSTRACT

A method includes receiving an identification of a plurality of circuit components to be included in an IC layout. Data are generated representing a first pattern to connect two of the circuit components. The first pattern has a plurality of segments. At least two of the segments have lengthwise directions perpendicular to each other. At least one pattern-free region is reserved adjacent to at least one of the at least two segments. Data are generated representing one or more additional patterns near the first pattern. None of the additional patterns is formed in the pattern-free region. The first pattern and the additional patterns form a double-patterning compliant set of patterns. The double-patterning compliant set of patterns are output to a machine readable storage medium to be read by a system for controlling a process to fabricate a pair of masks for patterning a semiconductor substrate using double patterning technology.

19 Claims, 10 Drawing Sheets

OTHER PUBLICATIONS

K. Bubke et al., Mask Characterization for Double Patterning Lithography, Journal of Micro/Nanolithography, MEMS and MOEMS, 10 pages, Jan. 2009.*

Mitra et al., RADAR: RET-Aware Detailed Routing Using Fast Lithography Simulations, Proceedings of the 42nd Design Automation COnference, pp. 369-372, Jun. 2005.*

* cited by examiner

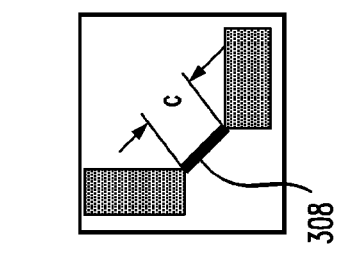 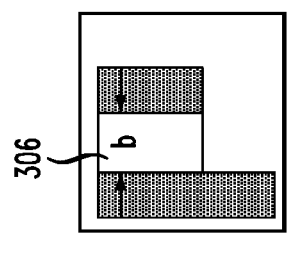 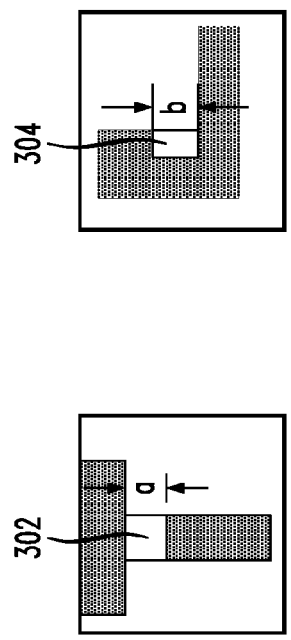
FIG. 3A  FIG. 3B  FIG. 3C  FIG. 3D
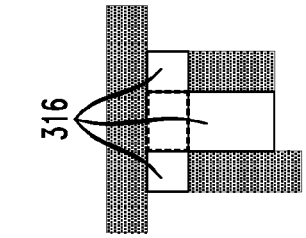 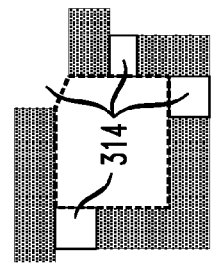 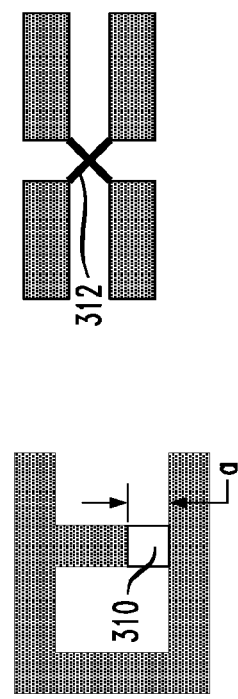
FIG. 3E  FIG. 3F  FIG. 3G  FIG. 3H

ROUTING SYSTEM AND METHOD FOR DOUBLE PATTERNING TECHNOLOGY

This application claims the benefit of U.S. Provisional Patent Application No. 61/261,852, filed Nov. 17, 2009, which is expressly incorporated by reference herein in its entirety.

FIELD OF THE INVENTION

The present disclosure relates to semiconductor fabrication generally and more specifically to double patterning.

BACKGROUND

In semiconductor fabrication processes, the resolution of a photoresist pattern begins to blur at about 45 nanometer (nm) half pitch. To continue to use fabrication equipment purchased for larger technology nodes, double exposure methods have been developed.

Double exposure involves forming patterns on a single layer of a substrate using two different masks in succession. As a result, a minimum line spacing in the combined pattern can be reduced while maintaining good resolution. In a method referred to as double dipole lithography (DDL), the patterns to be formed on the layer are decomposed and formed on a first mask having only horizontal lines, and on a second mask having only vertical lines. The first and second masks are said to have 1-dimensional (1-D) patterns, which can be printed with existing lithographic tools.

Another form of double exposure is referred to as double patterning technology (DPT). Unlike the 1-D approach of DDL, DPT in some cases allows a vertex (angle) to be formed of a vertical segment and a horizontal segment on the same mask. Thus, DPT generally allows for greater reduction in overall IC layout than DDL does. DPT is a layout splitting method analogous to a two coloring problem for layout splitting in graph theory. The layout polygon and critical space are similar to the vertex and edge of the graph respectively. Two adjacent vertices connected with an edge should be assigned different colors. Only two "color types" can be assigned. Each pattern on the layer is assigned a first or second "color"; the patterns of the first color are formed by a first mask, and the patterns of the second color are formed by a second mask. A graph is 2-colorable only if it contains no odd-cycle and loop. Although DPT has advantages, it is computationally intensive.

FIGS. 1A and 1B show two examples of pattern layouts that present odd-cycle situations and are not 2-colorable. In FIGS. 1A and 1B, the line width is labeled W, the minimum space between lines is labeled S, and the center-to-center pitch between lines is labeled P. In FIG. 1A, the segments 50, 52 and 54 form a first pattern 49 with nearby additional patterns 56 and 58. There are three spatial relationships (indicated by dashed lines), which would violate DPT constraints if put in the same mask. Patterns 49 and 56 are too close to be put in the same mask, because segment 50 and pattern 56 are too close. Patterns 49 and 58 are too close to be put in the same mask because segment 54 and pattern 58 are too close. Patterns 56 and 58 are similarly too close to each other to be put in the same mask. Thus, there is no way to distribute the first pattern 49 and the two additional patterns 56 and 58 between two masks without violating a DPT constraint. In terms of graph theory, when the total number of relationships between patterns that violate the minimum spacing for a single mask is odd, an odd cycle is present, and DPT cannot be used without changing the layout.

FIG. 1B shows a similar odd cycle situation. Segments 60, 62 and 64 form a first pattern 59. The patterns 59, 70, 72, 74 and 76 have five relationships (shown by dashed lines) that violate minimum spacing constraints for being formed in the same mask as each other. Because the number of relationships violating the minimum spacing requirements is an odd number, an odd cycle is present, and DPT cannot be used without changing the layout.

If two features are so close that a high resolution exposure cannot be obtained by DDL or DPT decomposition, the pattern is said to have a "native conflict". Such a problem can be addressed by changing the layer design, possibly at great expense. Conventional DPT aware routers may take a long run time and still not converge to a conflict-free layout.

Improved methods for automating the double exposure decomposition process are desired.

SUMMARY OF THE INVENTION

In some embodiments, a routing method comprises receiving an identification of a plurality of circuit components to be included in an integrated circuit (IC) layout. Data are generated representing a first pattern to connect two of the plurality of circuit components. The first pattern has a plurality of segments, such that at least two of the segments have lengthwise directions perpendicular to each other. At least one pattern-free region is reserved adjacent to at least one of the at least two segments. Data are generated representing one or more additional patterns near the first pattern, such that none of the additional patterns is formed in the pattern-free region, and the first pattern and the additional patterns form a double-patterning compliant set of patterns. The double-patterning compliant set of patterns are output to a machine readable storage medium to be read by a system for controlling a process to fabricate a pair of masks for patterning a semiconductor substrate using double patterning technology.

A system for performing the method and a computer readable medium encoded with computer program code for performing the method are also disclosed.

In some embodiments, a routing method comprises receiving an identification of a plurality of circuit components to be included in an integrated circuit (IC) layout having a routing grid, a preferred direction and a non-preferred direction. Data are generated representing a first pattern to connect two of the plurality of circuit components. The first pattern has a plurality of segments, such that at least two of the segments extend along respective lines of the routing grid in the preferred direction and have respective ends connected by at least one jog segment extending in the non-preferred direction. Each jog segment spans an odd number of lines of the routing grid of the IC layout. Data are generated representing one or more additional patterns located on lines of the routing grid near the first pattern, such that the first pattern and the additional patterns form a double-patterning compliant set of patterns. The double-patterning compliant set of patterns are outputted to a machine readable storage medium to be read by a system for controlling a process to fabricate a pair of masks for patterning a semiconductor substrate using double patterning technology.

BRIEF DESCRIPTION OF THE DRAWINGS

FIGS. 3A to 3H show G0 rule used in an exemplary embodiment to identify patterns too close to be formed using a single mask.

DETAILED DESCRIPTION

Figure 1:
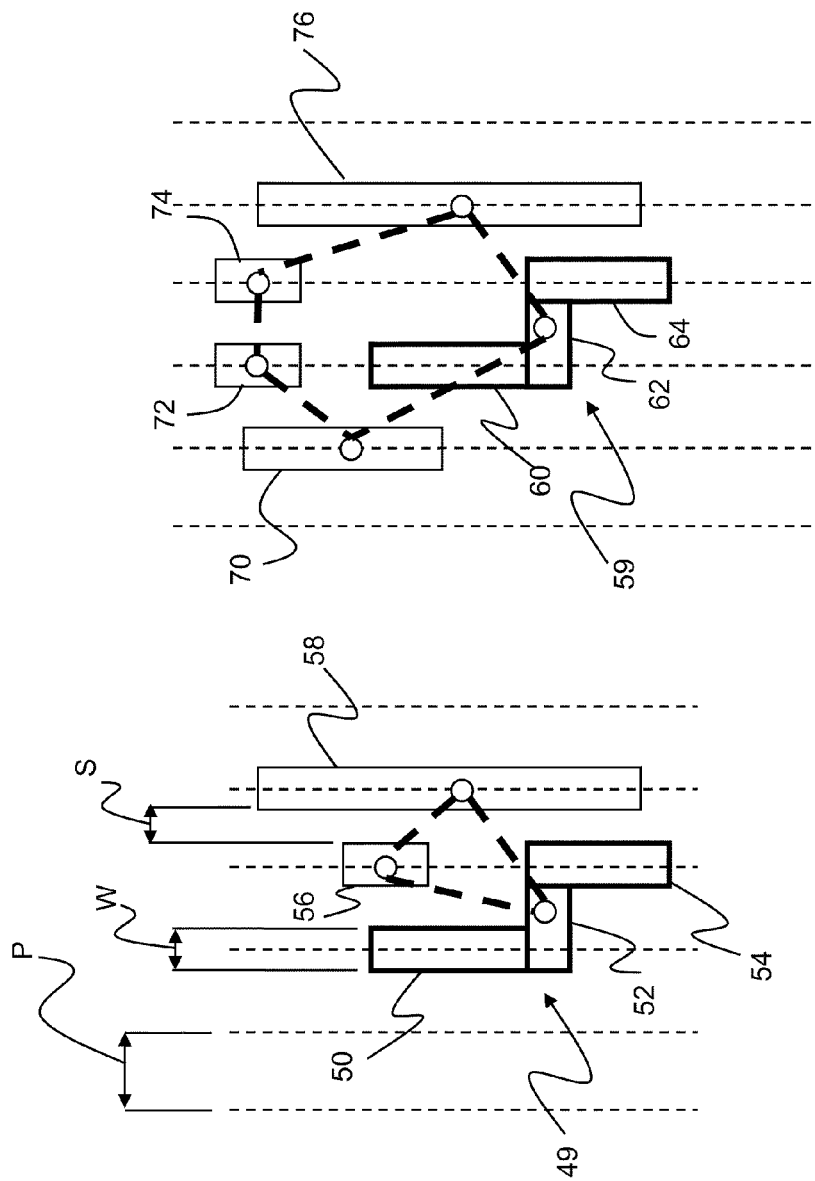
FIGS. 1A and 1B show odd cycle patterns formed in the prior art.

This description of the exemplary embodiments is intended to be read in connection with the accompanying drawings, which are to be considered part of the entire written description. In the description, relative terms such as "lower", "upper", "horizontal", "vertical", , "above", "below", "up", "down", "top"and "bottom" as well as derivative thereof (e.g., "horizontally", "downwardly", "upwardly", etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Figure 2:
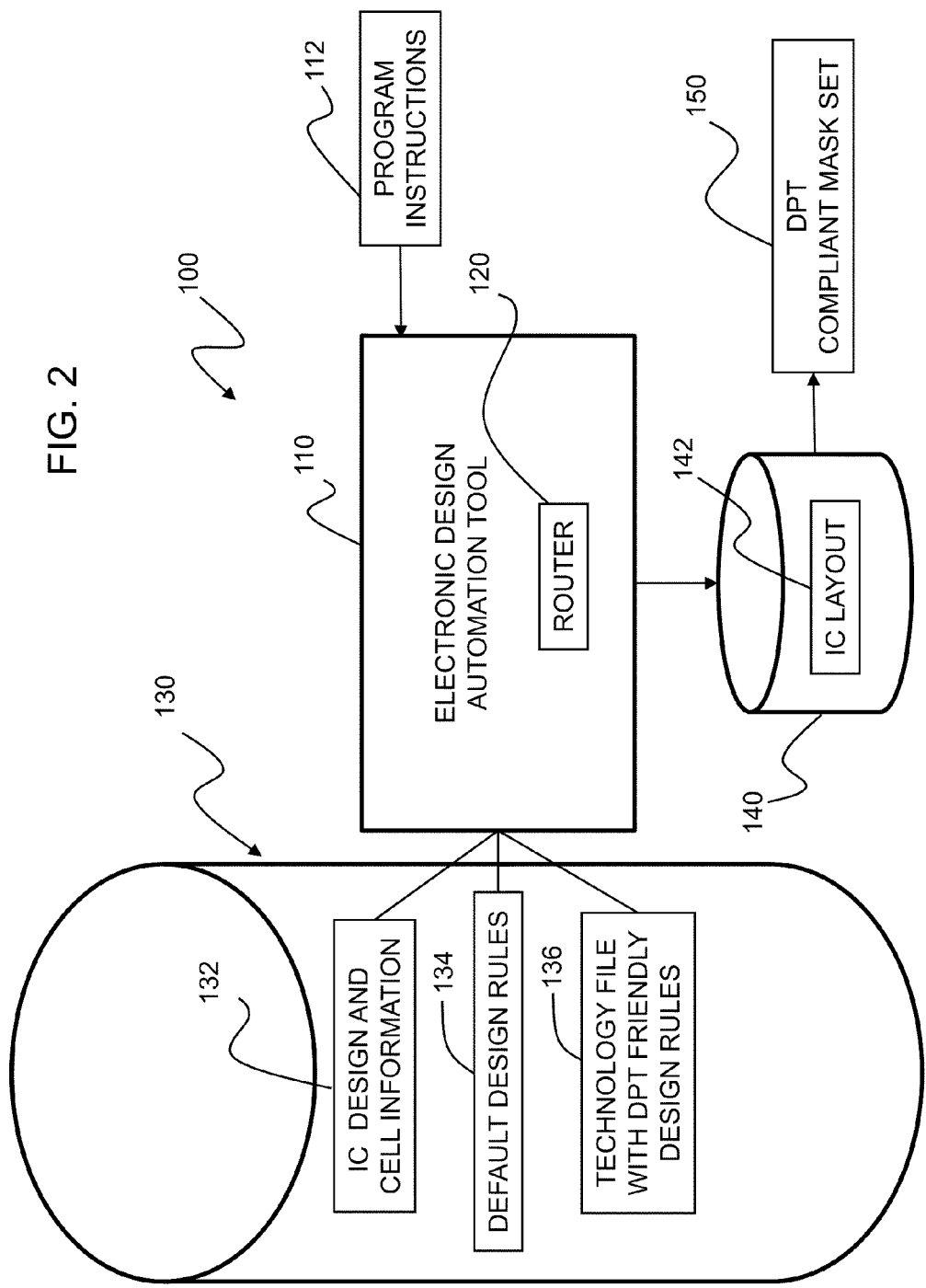
FIG. 2 is a block diagram of a system according to one embodiment.

FIG. 2 shows a system 100 having an electronic design automation (EDA) tool 110 such as "IC COMPILER" ™, sold by Synopsis, Inc. of Mountain View, Calif., including a router 120 such as "ZROUTE" ™, also sold by Synopsis. Other EDA tools 110 may be used, such as the "VIRTUOSO" custom design platform or the Cadence "ENCOUNTER"® digital IC design platform may be used, along with the "VIRTUOSO" chip assembly router 120, all sold by Cadence Design Systems, Inc. of San Jose, Calif. The EDA tool 110 is a special purpose computer formed by retrieving stored program instructions from a computer readable storage medium 112 and executing the instructions on a general purpose processor.

One or more computer readable storage media 130 are provided to store input data used by the EDA tool 110. The storage medium 130 may include one or more of dynamic random access memory (RAM), SDRAM, a read only memory (ROM), EEPROM, a hard disk drive (HDD), an optical disk drive (CD-ROM, DVD-ROM or BD-ROM), or a flash memory, or the like. The router 120 is capable of receiving an identification of a plurality of cells to be included in an integrated circuit (IC) layout, including a list 132 of pairs of cells within the plurality of cells to be connected to each other.

The router may be equipped with a set of default design rules 134, which may be used for larger technology nodes (e.g., 90 nm), which do not require DDL or DPT.

According to some embodiments, an additional set of rules 136 is provided to facilitate generation of DPT friendly patterns. The additional rules 136 may be inputted to the router in the form of a technology file, for example. The "DPT friendly" design rules are adapted for use in smaller technologies which use double exposure techniques. The term "DPT friendly" refers to patterns which are capable of being decomposed for DPT, so that each of the two masks used to pattern a single layer can perform an exposure with high resolution.

For example, in some embodiments, the design rules 136 further configure the router 120 for locating connecting lines and vias exclusively on a manufacturing grid. This is a change from the traditional practice of allowing placement of vias anywhere along the lines to which they are connected.

A computer readable storage medium 140 is provided, for outputting an IC layout 142. The medium 140 may be a separate storage device, or a portion of the same storage medium 130 described above. The medium 140 may be any of the types of storage media described above with respect to medium 130.

The IC layout 142 is then usable for generating DPT compliant mask sets, which may include two masks for any double patterned layer.

FIGS. 3A-3H define a set of G0 rules for determining whether a given set of patterns can be used in a G0 compliant routing pattern. The parameter G0 is derived as a function of the minimum line spacing. FIGS. 3A to 3D show an example of a set of definitions of relevant line spacing criteria, given a minimum line spacing S defined by the routing grid. The minimum spacing S is a parameter of a particular process technology node. For example, for a 45 nm technology process, S=70 nm; for a 65 nm process, S=100 nm. Criteria are applied to determine whether a given spatial relationship between two of the patterns in a routing layout would create a "G0 space". For a region of the layout surrounded by a plurality of patterns, DPT may be possible if the number of G0 spaces surrounding the region of the layout is even. On the other hand, a 2-colorable layout is not achieved if the number of G0 spaces surrounding the region of the layout is odd.

In FIG. 3A, the G0-rule for end-end/end-run space is shown. A "G0 space" is formed in an area 302, for which the end-end or end-run distance is less than 2.1*S. If the distance is greater than 2.1*S, then these two patterns do not form a G0 space between them. If the distance is between 5 and 2.1*S, then a G0 space 302 is formed as shown in FIG. 3A. An even number of G0 spaces around a given region of the layout can nevertheless result in a DPT compliant layout. Thus a G0 space is formed when an end-to-end distance between two of the plurality of segments which are aligned with each other, or between two of the additional patterns which are aligned with each other, or between one of the plurality of segments and one of the additional patterns aligned therewith, to at least 2.1 times a minimum line spacing used between pairs of adjacent lines that are both oriented in the preferred direction of the IC layout. Also, a G0 space is formed when an end-to-run distance between two of the plurality of segments which are unconnected and perpendicular to each other, or between two of the additional patterns which are unconnected and perpendicular to each other, or between one of the plurality of segments and one of the additional patterns which are unconnected and perpendicular to each other, to at least 2.1 times a minimum line spacing used between pairs of adjacent lines that are both oriented in the preferred direction of the IC layout.

FIGS. 3B and 3C show the G0-rule for run-run space. A "G0 space" is formed in an area 304 or 306, for which the run-run distance is less than 1.6*S. If the distance is greater than 1.6*S, then these two patterns do not form a G0 space between them. If the distance is between 5 and 1.6*S, then an even number of G0 spaces around a given region of the layout can nevertheless result in a DPT compliant layout. Thus, a G0 space is formed if a run-to-run distance between two of the plurality of segments which are parallel to each other and extend in a non-preferred direction of the IC layout, or between two of the additional patterns which are parallel to each other and extend in the non-preferred direction, or between one of the plurality of segments and one of the additional patterns which are parallel to each other and extend in the non-preferred direction, to at least 1.6 times a minimum line spacing used between pairs of adjacent lines that are both oriented in the preferred direction of the IC layout.

FIG. 3D shows the G0-rule for corner-corner space <1.6S. A "G0 space" is formed in an area 308, for which the corner-corner distance is less than 1.6*S. If the distance is greater than 1.6*S, then these two patterns do not form a G0 space between them. If the distance is between S and 1.6*S, then an even number of G0 spaces around a given region of the layout can nevertheless result in a DPT compliant layout. Thus, a G0 space is formed when a corner-to-corner distance between two of the plurality of segments which are unconnected and perpendicular to each other, or between two of the additional patterns which are unconnected and perpendicular to each other, or between one of the plurality of segments and one of the additional patterns which are unconnected and perpendicular to each other, to at least 2.1 times a minimum line spacing used between pairs of adjacent lines that are both oriented in the preferred direction of the IC layout.

The description of FIGS. 3A-3D above provides a non-limiting example. Different technologies may use different threshold values for identifying a G0 space. That is, in other embodiments, the threshold distance may differ from 1.6*S or 2.1*S (e.g., 1.8*S, 2.4*S, or the like). In some embodiments, the G0 threshold may be a constant number regardless of the minimum spacing S. In other embodiments, the G0 threshold may use the same multiple of S (e.g., 2.1*S) for all of the spacings of FIGS. 3A-3D.

FIGS. 3E to 3H show additional constraints on the G0 spaces. In FIG. 3E, a pattern that forms a G0 space 310 with itself is not permitted in a DPT compliant layout.

In FIG. 3F, four patterns forming two corner-corner G0 spaces that overlap are not permitted. If the diagonals of two corner-corner G0 spaces cross each other, then the patterns are not permitted.

FIG. 3G shows an example of a region surrounded by four G0 spaces (even cycle), resulting in a DPT compliant layout configuration.

FIG. 3H shows an example of a region surrounded by three G0 spaces (odd cycle), resulting in a layout that is not DPT compliant and not permitted.

FIGS. 4A to 4D show a simple set of rules that can be inputted to a router 120 to cause the router to generate DPT compliant layouts that can still make efficient use of space by keeping the same preferred direction run-run pitch without increasing the distance between preferred direction lines when possible. In FIGS. 4A-4D, the vertical direction is the preferred direction, and the horizontal direction is the non-preferred direction. One of ordinary skill in the art understands that in any given layer, the horizontal direction may alternatively be selected as the preferred direction. As used herein, a rectangular pattern having its longer sides extending in the preferred direction (and its shorter sides extending in the non-preferred direction) is referred to as extending in the preferred direction. Similarly, a rectangular pattern having its longer sides extending in the non-preferred direction (and its shorter sides extending in the preferred direction) is referred to as extending in the non-preferred direction.

The method may include three components: (1) increased end-end spacing, (2) differential run-run spacing for preferred and non-preferred directions, and (3) the inclusion of "keepout regions" or pattern-free regions adjacent non-preferred direction jogs in a pattern.

Figure 4C:
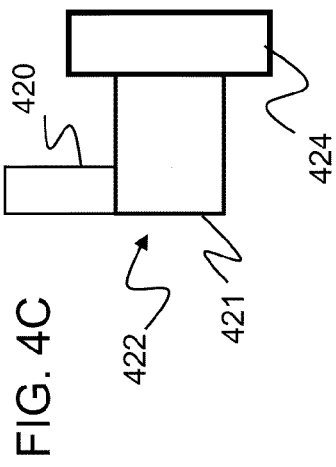
FIGS. 4C and 4D show pattern-free regions adjacent jog segments.
Figure 4D:
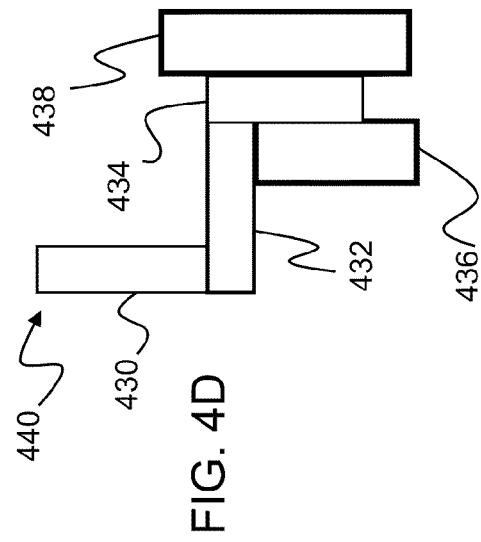
Figure 4A:
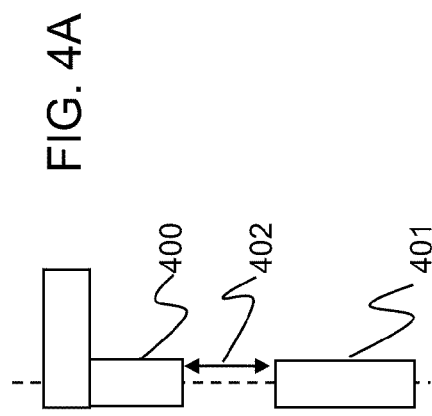
FIGS. 4A and 4B show line spacing criteria.

FIG. 4A shows two aligned segments 400, 401 oriented in the preferred direction. The end-end spacing for these segments is increased to be greater than G0 (i.e., >2.1*S).

Figure 4B:
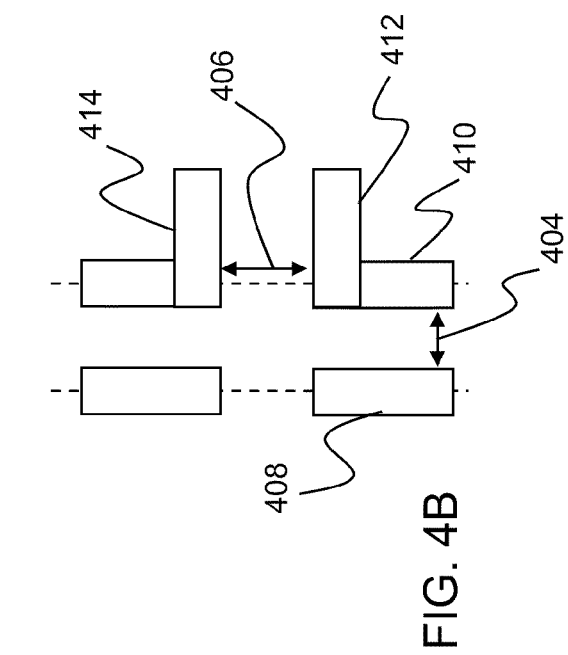

FIG. 4B shows the differential run-run spacing for preferred and non-preferred directions. The run-run spacing 406 between non-preferred direction segments 412 and 414 is increased to be greater than G0 (i.e., >1.6*S). However, the run-run spacing 404 between preferred direction segments 408 and 410 is maintained at the minimum spacing S. By allowing the minimum spacing between adjacent lines in the preferred direction, the compact size of the layout is maintained.

FIGS. 4C and 4D show the concept of a keepout region or pattern-free region. The inputs to the router include an instruction to define at least one keepout region or pattern-free region whenever there is a non-preferred direction jog in a layout pattern. FIG. 4C shows a pattern 422 comprising a preferred direction segment 420 with a non-preferred direction segment 421. A pattern-free region 424 is reserved adjacent the non-preferred direction segment 421. This pattern-free region 424 is used to override any router decision that would otherwise generate another pattern occupying or overlapping the region 424, without increasing the minimum run-run spacing between preferred direction lines throughout the entire layout. The width of the pattern free region 424 is 2.1*S (in other embodiments, the width may be a different multiple, such as 1.6*S). Thus the effect of the pattern free region is to increase the X direction spacing between preferred direction lines to 1.6*S only when there is a non-preferred direction jog, but to allow the minimum spacing S between preferred direction lines that are not connected to any non-preferred direction jog segments. The effect of this rule is to ensure that there will be an even number of G0 spaces.

FIG. 4D shows a pattern 440 comprising a first preferred direction segment 430, a non-preferred direction segment 432, and a second preferred direction segment 434. Two pattern-free regions 436 and 438 are reserved, one on each side the preferred direction segment 434.

Figure 5A:
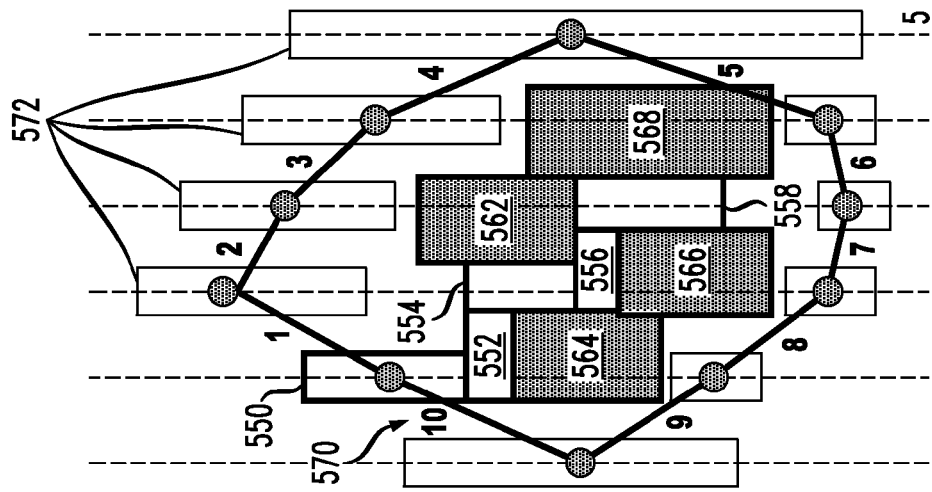
FIGS. 5A to 5C show even cycle layouts generated using the pattern free regions of FIGS. 4C and 4D.
Figure 5B:
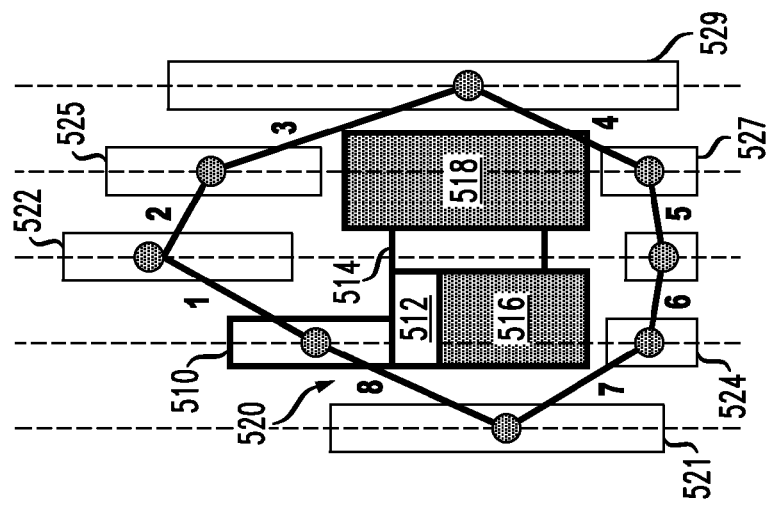
Figure 5C:
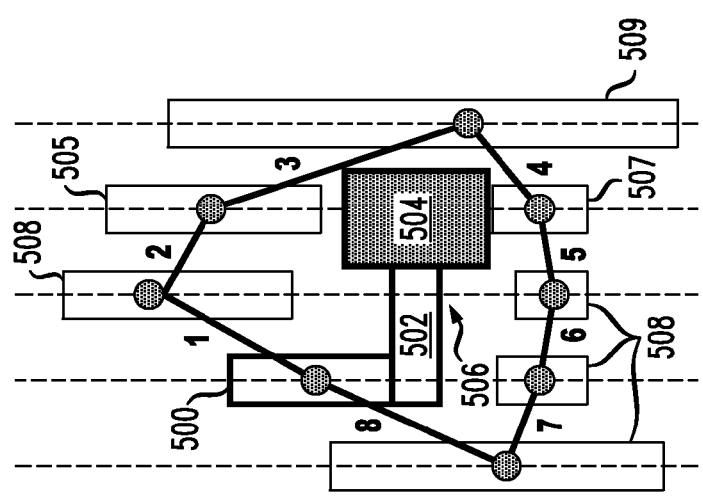

FIGS. 5A-5C show first patterns 506, 520 and 570 including one or more non-preferred direction jogs, with pattern free regions reserved adjacent to the first patterns. A plurality of additional patterns 508, 522 and 572 are formed around each of the first patterns, outside of the pattern-free regions. None of the additional patterns is formed in the pattern-free region, and the first pattern and the additional patterns form a double-patterning compliant set of patterns.

Referring first to FIG. 5A, the first pattern has preferred and non-preferred direction segments 500 and 502 which form a right angle. A pattern free region 504 is reserved adjacent the -preferred direction segments 502. In the example, the pattern free region is a rectangle. One of the segments 502 has a longer side and a shorter side. The shorter side has two corners, and a longer side of the pattern-free region 504 abuts the shorter side of the one segment 502. The length of the pattern free region is sufficient so that the longer side of the pattern-free region 504 extends beyond both corners of the shorter side of the one segment 502. That is, the length of pattern free region 504 is greater than the width of the non-preferred direction segment 502. The width of the pattern free region is at least 2.1 times a minimum line spacing S used between pairs of adjacent lines that are both oriented in the preferred direction of the IC layout (In other embodiments, the width may be a different multiple, such as 1.6*S).

A plurality of additional patterns (e.g., 505, 507, 508 and 509) are formed near the first pattern 506, such that none of the additional patterns is formed in the pattern-free region 504, and the first pattern and the additional patterns form a double-patterning compliant set of patterns. The inclusion of the pattern free region 504 ensures that there is no G0 space around the protected patterns. For example, in FIG. 5A, pattern free region 504 protects pattern 502, and is intended to prevent any G0 space from occurring among segment 502 and the segment 505 above region 504, segment 507 below region 504, and segment 509 to the right of region 504. The avoidance of an end-run G0 space between segment 502 and any of segments 505, 507 and 509 prevents an odd cycle configuration from occurring, and provides an even cycle configuration that is DPT compliant.

FIG. 5B similarly shows a first pattern 520 having three segments 510, 512, 514 and two turns. Two segments 512 and 514 form an angle, with a first one segment 512 having a longer side thereof in a non-preferred direction of the IC layout and a second segment 514 having a longer side thereof in a preferred direction of the IC layout.

A respective pattern-free region 516, 518 is reserved for each of the two turns. The first pattern free region 518 is positioned at the end of the horizontal jog segment 512, adjacent the segment 514. The pattern free region 518 is configured similarly to the region 504.

The second pattern free region 516 is reserved inside the angle formed by segments 512 and 514. A shorter side of the pattern-free region 516 abuts the longer side of the first segment 512. A longer side of the pattern-free region 516 abuts the longer side of the second segment 514 and extends in the preferred direction beyond an end of the longer side of the second segment. The width of the pattern free region 516 is at least 2.1 times a minimum line spacing S used between pairs of adjacent lines that are both oriented in the preferred direction of the IC layout (In other embodiments, the width may be a different multiple, such as 1.6*S).

The inclusion of the pattern free region 518 ensures that there is no G0 space between the protected segment 512 and any of the patterns 525, 527 or 529 surrounding region 518, or between the protected segment 514 and any of the patterns 525, 527 or 529 surrounding region 518, similar to the function of pattern-free region 504 described above. Also, the inclusion of the pattern free region 516 ensures that there is no G0 space between the protected segment 512 and either of the patterns 521 or 524 around region 516, or between the protected segment 514 and either of the patterns 521 or 524. In other words, the protected segments 512 and 514 do not have any G0 spaces abutting them. The avoidance of these potential G0 spaces prevents an odd cycle configuration from occurring, and provides an even cycle configuration that is DPT compliant.

FIG. 5C shows a first pattern 570 having five segments 550, 552, 554, 556 and 558 and four included turns. Two segments 552 and 554 form an angle, with a first one segment 552 having a longer side thereof in a non-preferred direction of the IC layout and a second segment 554 having a longer side thereof in a preferred direction of the IC layout. Segments 556 and 558 form another angle.

There is a respective pattern-free region 562, 564, 566 and 568 reserved at the included angle at each of the four turns. The first pattern free region 562 is positioned at the end of the horizontal jog segment 552, adjacent the segment 554. The pattern free region 568 is configured similarly to the region 504.

The pattern free regions 562, 564 and 566 are reserved inside the angles formed by segments 562, 564, 566 and 568. A shorter side of each pattern-free region 562, 564 and 566 abuts the longer side of one of the first segments 552 or 556. A longer side of each of the pattern-free regions 562, 564 and 566 abuts the longer side of one of the second segments 554 or 558 and extends in the preferred direction beyond an end of the longer side of the second segment. In each case, the longer side of the pattern-free region 562, 564 or 566 extends away from the abutting non-preferred direction segment (first segment) 552 or 556 at least as far as an end of the second segment 554 or 558 (segment abutting the longer side of the pattern free region) furthest from the first segment 552 or 556. The width of the pattern free regions 562, 564, 566 and 568 are at least 2.1 times a minimum line spacing S used between pairs of adjacent lines that are both oriented in the preferred direction of the IC layout (In other embodiments, the width may be a different multiple, such as 1.6*S).

The inclusion of the pattern free regions 562, 564, 566 and 568 avoids G0 spaces adjacent to any of the segments 552, 554, 556 or 558. The avoidance of these potential G0 spaces prevents an odd cycle configuration from occurring, and provides an even cycle configuration that is DPT compliant.

FIGS. 5A-5C are only examples, and pattern free regions may be reserved adjacent to a variety of patterns, where the plurality of segments includes one or more non-preferred direction jogs connecting preferred direction segments; and for each jog a respective pair of pattern free regions abuts the respective preferred direction segment on respective preferred direction edges thereof.

Figure 6:
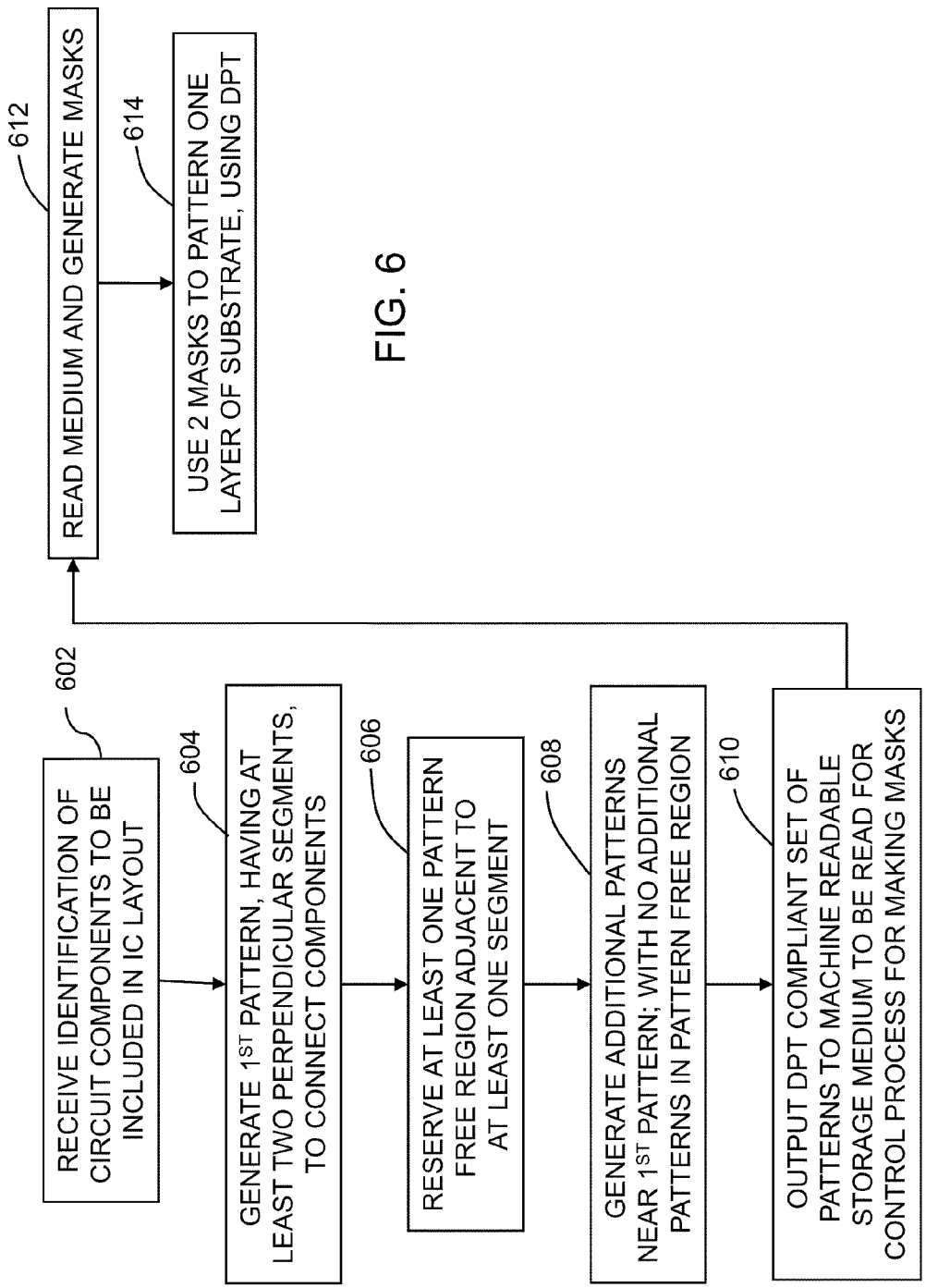
FIG. 6 is a flow chart for an exemplary method.

FIG. 6 is a flow chart of a routing method using the method and system described above.

At step 602, the system receives an identification of a plurality of circuit components to be included in an integrated circuit (IC) layout.

At step 604, the system generates data representing a first pattern to connect two of the plurality of circuit components. The first pattern has a plurality of segments, such that at least two of the segments have lengthwise directions perpendicular to each other.

At step 606, the system reserves at least one pattern-free region adjacent to at least one of the at least two segments.

At step 608, the system generates data representing one or more additional patterns near the first pattern, such that none of the additional patterns is formed in the pattern-free region, and the first pattern and the additional patterns form a double-patterning compliant set of patterns.

At step 610, the system outputs the data representing double-patterning compliant set of patterns to a machine readable storage medium to be read by a system for controlling a process to fabricate a pair of masks for patterning a semiconductor substrate using double patterning technology.

At step 612, a mask generating tool reads the data representing the double-patterning compliant set of patterns from the machine readable storage medium, and forms a set of masks suitable for double patterning.

At step 614, two masks are used to pattern the same semiconductor substrate using double patterning technology.

Figure 7C:
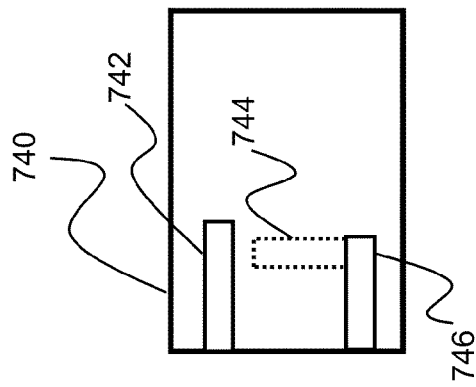
FIGS. 7A to 7C show 2-color issues inside of circuit components (IPs).
Figure 7B:
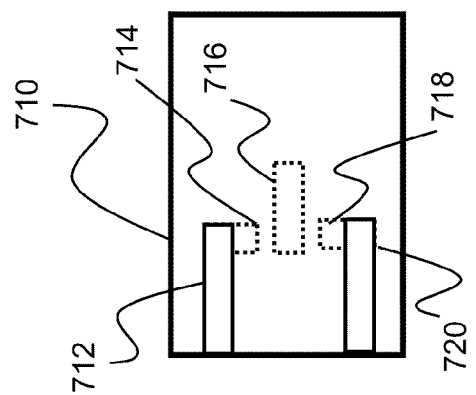
Figure 7A:
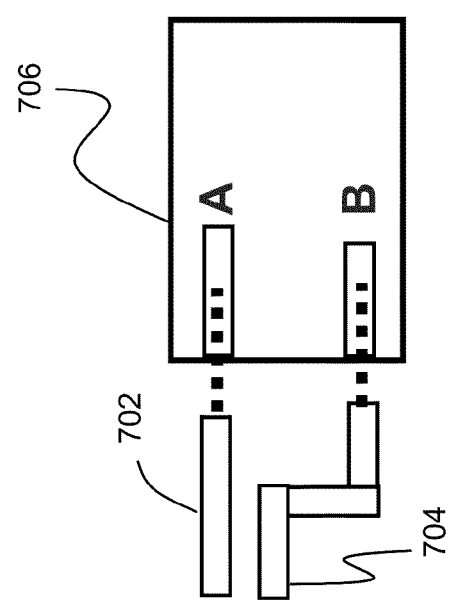

FIGS. 7A to 7C show an additional double patterning issue which may arise at the point of connection with the circuit components (which may be a cell or macro block of a cell library). FIG. 7A shows the portion of the layout at which the routing paths join the circuit component. The routing paths 702 and 704 may include sections which lie less than the G0 distance from each other. For example, using the G0 rules discussed above, the paths 702 and 704 are less than 1.6*S apart. This distance is too close to form patterns 702 and 704 with a single mask. This may cause an issue if the circuit component 706 requires the lines at the entry of the circuit component to be the same color.

FIGS. 7B and 7C show two possible scenarios. In FIGS. 7B and 7C, the dashed lines represent circuit paths that may not be known by the router. In FIG. 7B, the unknown patterns 714 and 718 must be the same first color, and unknown pattern 716 must be a second color. Thus, segments 712 and 720 must be the same first color. This could cause a conflict if the routing paths 702 and 704 of FIG. 7A are used, because they are too close to be formed by a single mask (i.e., too close to be the same color).

In FIG. 7C, on the other hand, patterns 742 and 744 must be two different colors. Since segments 744 and 746 are formed using the same mask, patterns 742 and 746 must be two different colors.

Figure 8:
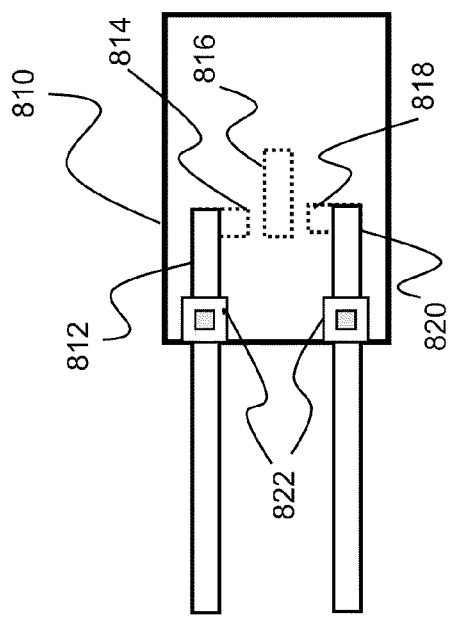
FIG. 8 shows a technique for using vias inside an IP to address colorability.

FIG. 8 shows a variation of the technique described above. FIG. 8 shows an example of a circuit component (IP) 810 similar to the component 710 shown in FIG. 7B. The patterns 812, 814, 816, 818 and 820 are similar to the corresponding patterns 712, 714, 716, 718 and 720. In IP 810, however, vias 822 are provided inside the circuit IP 810. Because the patterns shown on the left side of the via (i.e., outside of the IP 810) are on a different layer than the patterns to the right of the via (i.e., inside the IP 810), the color relationships and distances between the patterns inside of the IP are not relevant to the router 120. This gives the router freedom to layout the routing paths outside of IP 810 without regard to the colors of the patterns within the IP.

Figure 9:
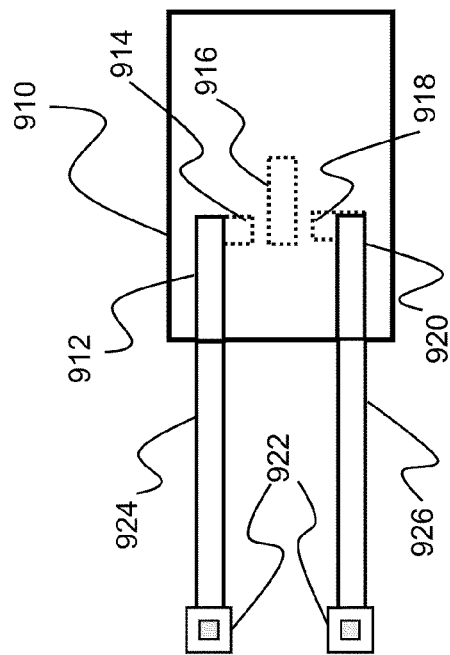
FIG. 9 shows an alternative technique for handling IP colorability.

FIG. 9 shows another alternative technique for isolating the color relationships of the routing paths from the relationships inside the IP. FIG. 9 shows an example of a circuit component (IP) 910 similar to the component 810 shown in FIG. 8. The patterns 912, 914, 916, 918 and 920 are similar to the corresponding patterns 812, 814, 816, 818 and 820. In FIG. 9, however, a pair of vias 922 are located by the router outside of the IP 910. Between the vias 922 and the IP 910, the patterns 924 and 926 are isolated from each other, by a distance greater than the G0 distance (e.g., >1.6*S). Since the patterns 924 and 926 are further apart than G0, they can be formed either by a single mask or by two different masks. Thus, this structure can accommodate IPs that need two different colors at the input pins, as well as IPs that need the same colors at the input pins.

The techniques described above can be used effectively to minimize layout space, for example, when a freestyle layout is used, allowing patterns to be routed in between the lines of the manufacturing grid. The same technique may be used when the patterns are only formed on the grid. An alternative technique may also be used when all the patterns are formed on the grid.

Figure 10:
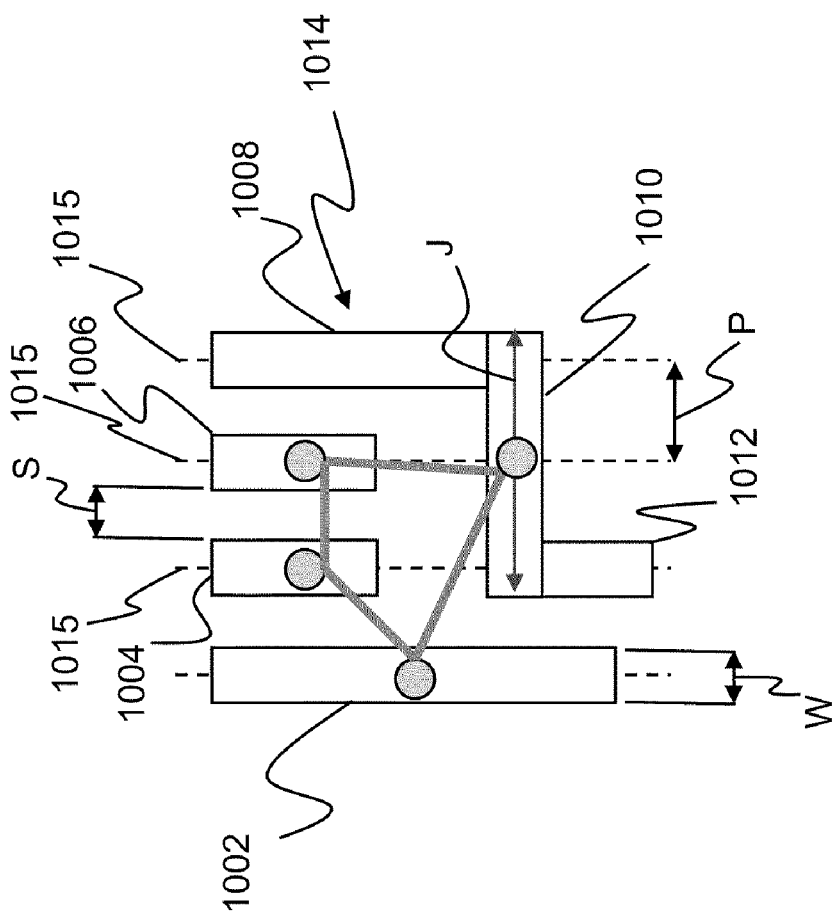
FIG. 10 is a diagram of a pattern using a variation of the exemplary method for an on-grid IC layout.

FIG. 10 shows an example of a set of patterns suitable to be patterned using DPT. The patterns 1002, 1004, 1006 and 1014 of FIG. 10 are formed using the G0 rules described above with reference to FIGS. 3A to 3H, 4A and 4B. However, the pattern-free regions are not required next to non-preferred direction jogs. Instead, all non-preferred direction jogs 1010 are restricted to even numbers times the minimum line pitch, plus one line width. Thus a jog may have a length of $2*P+W$, $4*P+W$, etc., where P is the minimum center-to-center pitch between lines (P=S+W), W is the line width, and S is the minimum space between lines. For example, preferred direction lines 1008 and 1012 are connected by a non-preferred direction jog segment 1010 having a length of $J=2*P+W$. Thus, the jog segment 1010 spans three routing tracks 1015 (with two full pitches between them). By only using jog lengths of an even number of pitches plus a line width (i.e., jog lengths that span an odd number of routing tracks), the IC layout of FIG. 10 also provides an even number of G0 spaces, ensuring a 2-colorable layout suitable for DPT.

In a routing method according to FIG. 10, the system receives an identification of a plurality of circuit components to be included in an integrated circuit (IC) layout having a routing grid, a preferred direction and a non-preferred direction. Data are generated representing a first pattern to connect two of the plurality of circuit components. The first pattern has a plurality of segments. At least two of the segments extend along respective lines of the routing grid in the preferred direction and have respective ends connected by a jog segment extending in the non-preferred direction. Each jog segment spans an odd number of lines of the routing grid of the IC layout. Date are generated representing one or more additional patterns located on lines of the routing grid near the first pattern, such that the first pattern and the additional patterns form a double-patterning compliant set of patterns. The double-patterning compliant set of patterns are outputted to a machine readable storage medium to be read by a system for controlling a process to fabricate a pair of masks for patterning a semiconductor substrate using double patterning technology.

Figure 11:
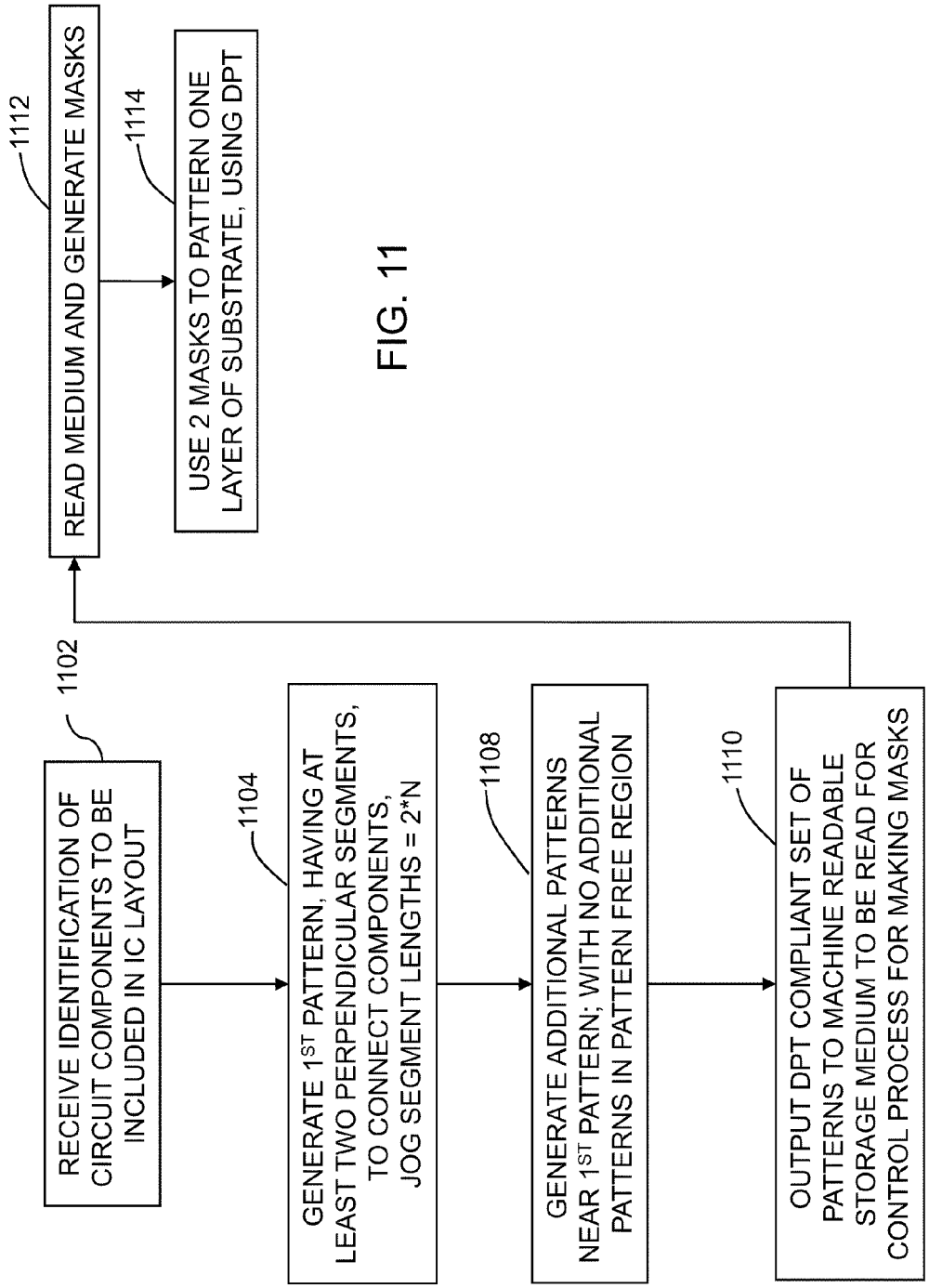
FIG. 11 is a flow chart for forming the layout of FIG. 10.

FIG. 11 is a flow chart of a routing method using the method and system described above with reference to FIG. 10.

At step 1102, the system receives an identification of a plurality of circuit components to be included in an integrated circuit (IC) layout.

At step 1104, the system generates data representing a first pattern to connect two of the plurality of circuit components. The first pattern has a plurality of segments, such that at least two of the segments have lengthwise directions perpendicular to each other, including at least one jog segment. The jog segment has a length that is an even number times the minimum line pitch P plus one line width ($J=2*N*P+W$, where N is an integer), so that the jog segment spans an odd number of routing grid lines. The outermost ones of the odd number of routing grid lines are separated from each other by a center-to-center distance that is an even multiple of P.

At step 1108, the system generates data representing one or more additional patterns near the first pattern, such that the first pattern and the additional patterns form a double-patterning compliant set of patterns.

At step 1110, the system outputs the data representing double-patterning compliant set of patterns to a machine readable storage medium to be read by a system for controlling a process to fabricate a pair of masks for patterning a semiconductor substrate using double patterning technology.

At step 1112, a mask generating tool reads the data representing the double-patterning compliant set of patterns from the machine readable storage medium, and forms a set of masks suitable for double patterning.

At step 1114, two masks are used to pattern the same semiconductor substrate using double patterning technology.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:
1. A routing method comprising steps of:
(a) receiving in a processor an identification of a plurality of circuit components to be included in an integrated circuit (IC) layout;

(b) generating data within the processor representing a first pattern to connect two of the plurality of circuit components, the first pattern having a plurality of segments, such that at least two segments of the plurality of segments have lengthwise directions perpendicular to each other;

(c) reserving at least one pattern-free region, wider than a minimum spacing between parallel lines, adjacent to at least one segment of the at least two of the plurality of segments to prevent the processor from generating another pattern occupying or overlapping the at least one pattern-free region without increasing the minimum spacing throughout the entire IC layout;

(d) generating data within the processor representing one or more additional patterns near the first pattern, such that none of the one or more additional patterns is formed in the at least one pattern-free region, and the first pattern and the one or more additional patterns form a double-patterning compliant set of patterns; and (e) outputting the double-patterning compliant set of patterns from the processor to a machine readable storage medium to be read by a system for controlling a process to fabricate a pair of masks for patterning a semiconductor substrate using double patterning technology.

2. The routing method of claim 1, wherein:
step (b) is performed in such a way that at least one of the plurality of segments has a longer side and a shorter side, the shorter side having two corners; and
step (c) is performed in such a way that a longer side of the at least one pattern-free region abuts the shorter side of the at least one segment; and
the longer side of the at least one pattern-free region extends beyond both corners of the shorter side of the at least one segment.

3. The routing method of claim 1, wherein step (c) is performed in such a way that the at least one pattern free region is a rectangle, and a width of a shorter side of the at least one pattern free region is at least 2.1 times a minimum line spacing used between pairs of adjacent lines that are both oriented in a preferred direction of the IC layout.

4. The routing method of claim 1, wherein:
step (b) is performed in such a way that the at least two segments form an angle, with a first segment of the at least two segments having a longer side thereof in a non-preferred direction of the IC layout and a second segment of the at least two segments having a longer side thereof in a preferred direction of the IC layout; and
step (c) is performed in such a way that a shorter side of the at least one pattern-free region abuts the longer side of the first segment; and
a longer side of the at least one pattern-free region abuts the longer side of the second segment and extends in the preferred direction beyond an end of the longer side of the second segment.

5. The routing method of claim 4, wherein step (c) is performed in such a way that the at least one pattern-free region extends away from the second segment at least as far as an end of the first segment that is furthest from the second segment.

6. The routing method of claim 4, wherein step (c) is performed in such a way that the at least one pattern-free region extends away from the second segment at least 2.1 times a minimum line spacing used between pairs of adjacent lines that are both oriented in the preferred direction of the IC layout.

7. The routing method of claim 1, wherein step (b) is performed in such a way that the at least two segments include respective turns between corresponding pairs of successive segments, and step (c) is performed in such a way that that the number of pattern-free regions reserved is equal to a number of turns.

8. The routing method of claim 7, wherein:
the IC layout has a preferred direction and a non-preferred direction, and
step (c) is performed in such a way that a plurality of pattern-free regions are rectangles, each pattern-free region having a longer side abutting an adjacent one of the plurality of segments and extending in the preferred direction beyond an end of the abutting segment, each pattern-free region having shorter sides extending in the non-preferred direction.

9. The routing method of claim 8, wherein step (c) is performed in such a way that each pattern-free region has a width of at least 2.1 times a minimum line spacing used between pairs of adjacent lines that are both oriented in the preferred direction of the IC layout.

10. The routing method of claim 8, wherein step (b) is performed in such a way that the plurality of segments includes one or more non-preferred direction jogs connecting preferred direction segments, and step (c) is performed in such a way that, for each jog a respective pair of pattern free regions abuts the respective preferred direction segment on respective preferred direction edges thereof.

11. The routing method of claim 1, further comprising for a given area surrounded by additional patterns, providing an even number of spaces abutted by ones of the additional patterns too close to each other to be formed by a single mask, wherein the relatively close patterns include one of the group consisting of:
at least one pattern having an end-to-end distance between two of the plurality of segments which are aligned with each other,
at least one pattern having an end-to-end distance between two of the additional patterns which are aligned with each other, and
at least one pattern having an end-to-end distance between one of the plurality of segments and one of the additional patterns aligned therewith, between 1 and 2.1 times a minimum line spacing used between pairs of adjacent lines that are both oriented in a preferred direction of the IC layout.

12. The routing method of claim 1, further comprising for a given area surrounded by additional patterns, providing an even number of spaces abutted by ones of the additional patterns too close to each other to be formed by a single mask, wherein the relatively close patterns include one of the group consisting of:
at least one pattern having an end-to-run distance between two of the plurality of segments which are unconnected and perpendicular to each other,
at least one pattern having an end-to-run distance between two of the additional patterns which are unconnected and perpendicular to each other, and
at least one pattern having an end-to-run distance between one of the plurality of segments and one of the additional patterns which are unconnected and perpendicular to each other, to at least 2.1 times a minimum line spacing used between pairs of adjacent lines that are both oriented in a preferred direction of the IC layout.

13. The routing method of claim 1, further comprising for a given area surrounded by additional patterns, providing an even number of spaces abutted by ones of the additional patterns too close to each other to be formed by a single mask, wherein the relatively close patterns include one of the group consisting of:
- at least one pattern having a run-to-run distance between two of the plurality of segments which are parallel to each other and extend in a non-preferred direction of the IC layout,
- at least one pattern having a run-to-run distance between two of the additional patterns which are parallel to each other and extend in the non-preferred direction, and
- at least one pattern having a run-to-run distance between one of the plurality of segments and one of the additional patterns which are parallel to each other and extend in the non-preferred direction, to at least 1.6 times a minimum line spacing used between pairs of adjacent lines that are both oriented in a preferred direction of the IC layout.

14. The routing method of claim 1, further comprising for a given area surrounded by additional patterns, providing an even number of spaces abutted by ones of the additional patterns too close to each other to be formed by a single mask, wherein the relatively close patterns include one of the group consisting of:
- at least one pattern having a corner-to-corner distance between two of the plurality of segments which are unconnected and perpendicular to each other,
- at least one pattern having a corner-to-corner distance between two of the additional patterns which are unconnected and perpendicular to each other, and
- at least one pattern having a corner-to-corner distance between one of the plurality of segments and one of the additional patterns which are unconnected and perpendicular to each other, to at least 1.6 times a minimum line spacing used between pairs of adjacent lines that are both oriented in a preferred direction of the IC layout.

15. The routing method of claim 1, wherein at least one of the circuit components is a cell or macro block of a cell library, the circuit component having a plurality of pins, the method further comprising generating data representing a plurality of paths connecting respective pins inside the at least one circuit component with respective ones of the group consisting of:
- a segment from the first pattern generated in step (b), and
- one of the plurality of additional patterns generated in step (d), wherein the at least one path includes a via inside the circuit component.

16. The routing method of claim 1, wherein at least one of the circuit components is a cell or macro block of a cell library, the method further comprising generating data representing a plurality of paths connecting respective pins of the at least one circuit component with respective ones of the group consisting of:
- a segment from the first pattern generated in step (b), and
- one of the plurality of additional patterns generated in step (d), wherein:
- each of the plurality of paths has a segment directly connected to a respective pin; and
- the directly connected segments of the plurality of paths are isolated from each other.

17. A routing method comprising:
(a) receiving in a processor an identification of a plurality of circuit components to be included in an integrated circuit (IC) layout having a routing grid, a preferred direction and a non-preferred direction;
(b) generating within the processor data representing a first pattern to connect two of the plurality of circuit components, the first pattern having a plurality of segments, such that at least two of the segments extend along respective lines of the routing grid in the preferred direction and have respective ends connected by a single jog segment extending in the non-preferred direction, each jog segment spanning an odd number of lines of the routing grid of the IC layout; and
(c) generating within the processor data representing one or more additional patterns located on lines of the routing grid near the first pattern, such that the first pattern and the one or more additional patterns form a double-patterning compliant set of patterns;
(d) outputting from the processor the double-patterning compliant set of patterns to a machine readable storage medium to be read by a system for controlling a process to fabricate a pair of masks for patterning a semiconductor substrate using double patterning technology.

18. A system comprising:
a computer readable storage medium storing data identifying a plurality of circuit components to be included in an integrated circuit (IC) layout; and
a processor coupled to the storage medium, embodying program instructions stored thereon, which when executed, configures the processor to perform steps comprising:
generating data representing a first pattern to connect two of the plurality of circuit components, the first pattern having a plurality of segments, such that at least two segments of the plurality of segments have lengthwise directions perpendicular to each other;
reserving at least one pattern-free region, wider than a minimum spacing between parallel lines, adjacent to at least one segment of the at least two of the plurality of segments to prevent the processor from generating another pattern occupying or overlapping the at least one pattern-free region without increasing the minimum spacing throughout the entire IC layout;
generating data representing one or more additional patterns near the first pattern, such that none of the one or more additional patterns is formed in the at least one pattern-free region, and the first pattern and the one or more additional patterns form a double-patterning compliant set of patterns; and
outputting the double-patterning compliant set of patterns to a machine readable storage medium to be read by a system for controlling a process to fabricate a pair of masks for patterning a semiconductor substrate using double patterning technology.

19. A computer readable storage medium encoded with computer program code such that, when the computer program code is executed by a processor, the processor performs a routing method comprising:
(a) receiving in the processor an identification of a plurality of circuit components to be included in an integrated circuit (IC) layout;
(b) generating within the processor data representing a first pattern to connect two of the plurality of circuit components, the first pattern having a plurality of segments, such that at least two segments of the plurality of segments have lengthwise directions perpendicular to each other;
(c) reserving at least one pattern-free region, wider than a minimum spacing between parallel lines, adjacent to at least one segment of the at least two of the plurality of segments to prevent the processor from generating another pattern occupying or overlapping the at least one pattern-free region without increasing the minimum spacing throughout the entire IC layout;

(d) generating within the processor data representing one or more additional patterns near the first pattern, such that none of the one or more additional patterns is formed in the at least one pattern-free region, and the first pattern and the one or more additional patterns form a double-patterning compliant set of patterns; and (e) outputting from the processor the double-patterning compliant set of patterns to a machine readable storage medium to be read by a system for controlling a process to fabricate a pair of masks for patterning a semiconductor substrate using double patterning technology.

\* \* \* \* \*